(12) United States Patent
Kawakami et al.

(10) Patent No.: US 8,686,401 B2
(45) Date of Patent: Apr. 1, 2014

(54) ULTRAVIOLET IRRADIATION APPARATUS

(75) Inventors: Yoichi Kawakami, Kyoto (JP); Mitsuru Funato, Kyoto (JP); Takao Oto, Kyoto (JP); Ryan Ganipan Banal, Kyoto (JP); Masanori Yamaguchi, Himeji (JP); Ken Kataoka, Himeji (JP); Hiroshige Hata, Himeji (JP)

(73) Assignees: Kyoto University, Kyoto (JP); Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/701,213

(22) PCT Filed: May 30, 2011

(86) PCT No.: PCT/JP2011/062322
§ 371 (c)(1),
(2), (4) Date: Dec. 17, 2012

(87) PCT Pub. No.: WO2011/152331
PCT Pub. Date: Dec. 8, 2011

(65) Prior Publication Data
US 2013/0075697 A1    Mar. 28, 2013

(30) Foreign Application Priority Data
Jun. 3, 2010 (JP) .................................. 2010128252

(51) Int. Cl.
*H01L 29/06* (2006.01)
(52) U.S. Cl.
USPC ................................ 257/14; 257/99; 257/434
(58) Field of Classification Search
USPC ......... 257/12–18, 88–103, 431–448, E33.008
See application file for complete search history.

(56) References Cited

U.S. PATENT DOCUMENTS 5,119,386 A      6/1992   Narusawa
7,301,175 B2 *  11/2007  Izuno et al. ..................... 257/98
(Continued)

FOREIGN PATENT DOCUMENTS

JP      2-188980 A     7/1990
JP      5-218589 A     8/1993
(Continued)

OTHER PUBLICATIONS

International Search Report and Written Opinion dated Jun. 28, 2011 in counterpart International Application No. PCT/JP2011/062322.

(Continued)

*Primary Examiner* — Cuong Q Nguyen
(74) *Attorney, Agent, or Firm* — Holtz, Holtz, Goodman & Chick

(57) ABSTRACT

Provided is a compact ultraviolet irradiation apparatus which is capable of emitting ultraviolet radiation with high efficiency.
This ultraviolet irradiation apparatus includes, in a vessel, a semiconductor multi-layered film element and an electron beam irradiation source for irradiating the semiconductor multi-layered film element with an electron beam, the vessel being hermetically sealed to have a negative internal pressure and having an ultraviolet transmitting window. Furthermore, the semiconductor multi-layered film element includes an active layer having a single quantum well structure or a multi quantum well structure of $In_xAl_yGa_{1-x-y}N$ ($0 \leq x < 1$, $0 < y \leq 1$, $x+y \leq 1$), and the active layer of the semiconductor multi-layered film element is irradiated with an electron beam from the electron beam irradiation source. This allows the semiconductor multi-layered film element to emit ultraviolet radiation out of the vessel through the ultraviolet transmitting window. Furthermore, Equation (1) below is satisfied, $$4.18 \times V^{1.50} \leq t \leq 10.6 \times V^{1.54}$$    Equation (1)

where V (kV) is the acceleration voltage of the electron beam and t (nm) is the thickness of the active layer.

2 Claims, 6 Drawing Sheets

(56) References Cited

U.S. PATENT DOCUMENTS

| | | | |
|---|---|---|---|
| 7,361,948 B2* | 4/2008 | Hirano et al. | 257/294 |
| 7,999,372 B2* | 8/2011 | Park | 257/98 |
| 2001/0019565 A1 | 9/2001 | Iwasaki et al. | |
| 2001/0028064 A1 | 10/2001 | Hirayama et al. | |
| 2004/0218651 A1 | 11/2004 | Iwasaki et al. | |
| 2012/0299051 A1* | 11/2012 | Jeong | 257/99 |

FOREIGN PATENT DOCUMENTS

| | | | |
|---|---|---|---|
| JP | 8-222786 A | 8/1996 | |
| JP | 9-214027 A | 8/1997 | |
| JP | 2001-237455 A | 8/2001 | |
| JP | 2001-251001 A | 9/2001 | |
| JP | 2006-190541 A | 7/2006 | |
| JP | 2007-294698 A | 11/2007 | |

OTHER PUBLICATIONS

International Preliminary Report on Patentability (form PCT/IPEA/409) dated Jun. 1, 2012.

* cited by examiner (A)

(B)

existing code here …

ULTRAVIOLET IRRADIATION APPARATUS

TECHNICAL FIELD

The present invention relates to an ultraviolet irradiation apparatus for emitting ultraviolet radiation by a semiconductor multi-layered film element being irradiated with an electron beam.

BACKGROUND ART

In recent years, the range of uses of compact ultraviolet light sources has been increasing; for example, new techniques to be applied to UV curing ink jet printers have been developed.

Known as a compact ultraviolet light source is an ultraviolet light emitting diode (LED) which employs, for example, a gallium nitride (GaN) based compound semiconductor. In such an ultraviolet LED, a composition ratio of aluminum (Al) in a GaN based compound semiconductor containing Al which forms an active layer may be changed, so that an emission wavelength is adjusted in the ultraviolet region of 380 nm or shorter, for example.

Under the circumstances, however, the ultraviolet LED becomes low in external quantum efficiency according to non-radiative transition due to defect in a semiconductor crystal, and to carrier overflow in the active layer and resistance loss from the construction that requires a p-type layer, which cannot but become a low carrier density by a high activation energy of a p-type impurity such as Mg, and is thus not practical.

Furthermore, known as an ultraviolet light source employing a semiconductor device is one which allows a semiconductor multi-layered film element to emit light by irradiating the semiconductor multi-layered film element with an electron beam from an electron beam irradiation source (see Patent Literature 1).

Since such an ultraviolet light source does not require the formation of a p-type semiconductor layer of an element inevitable for the LED, the ultraviolet light source is not affected by the quality of a p-type semiconductor layer, whereby it is possible to provide an ultraviolet light source which is capable of emitting ultraviolet radiation with stability.

However, the aforementioned ultraviolet light source has the following problem. To allow the semiconductor multi-layered film element to emit light with high efficiency, the semiconductor multi-layered film element needs to be irradiated with an electron beam accelerated by an acceleration voltage, for example, of a few tens of kV or greater, thereby likely causing the semiconductor multi-layered film element to emit an X-ray. Thus, if the element is used as the ultraviolet light source, the light source requires a structure for shielding the X-ray, which makes it difficult to provide a compact ultraviolet light source.

CITATION LIST

Patent Literature

Patent Literature 1: Publication of Japanese Patent No. 3667188

SUMMARY OF INVENTION

Technical Problem

The present invention has been made on the basis of the foregoing circumstances and has as its object the provision of a compact ultraviolet irradiation apparatus which is capable of emitting ultraviolet radiation with high efficiency.

Solution to Problem

The ultraviolet irradiation apparatus of the present invention is characterized by including, in a vessel, a semiconductor multi-layered film element and an electron beam irradiation source for irradiating the semiconductor multi-layered film element with an electron beam, the vessel being hermetically sealed to have a negative internal pressure and having an ultraviolet transmitting window.

The ultraviolet irradiation apparatus of the present invention is preferably configured such that: the semiconductor multi-layered film element includes an active layer having a single quantum well structure or a multi quantum well structure of $In_xAl_yGa_{1-x-y}N$ ($0 \leq x < 1$, $0 < y \leq 1$, $x+y \leq 1$); and that the active layer of the semiconductor multi-layered film element is irradiated with an electron beam from the electron beam irradiation source, thereby allowing the semiconductor multi-layered film element to emit ultraviolet radiation out of the vessel through the ultraviolet transmitting window.

Furthermore, Equation (1) below is preferably satisfied, $$4.18 \times V^{1.50} \leq t \leq 10.6 \times V^{1.54} \qquad \text{Equation (1)},$$

where V (kV) is the acceleration voltage of the electron beam and t (nm) is the thickness of the active layer.

Furthermore, the electron beam preferably has an acceleration voltage of 20 kV or lower.

Advantageous Effects of Invention

According to the ultraviolet irradiation apparatus of the present invention, the active layer of the semiconductor multi-layered film element has a thickness which falls within a particular range in relation to the acceleration voltage of an electron beam, thereby allowing ultraviolet radiation to be emitted with high efficiency. Moreover, since a high efficiency can be achieved even when the electron beam has a low acceleration voltage, the apparatus can be reduced in size.

DESCRIPTION OF EMBODIMENTS

Now, embodiments of the present invention will be explained below in more detail.

Figure 1:
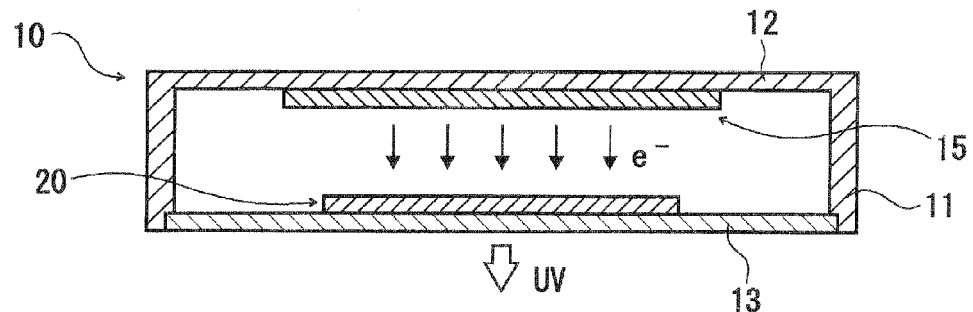
FIG. 1 is an explanatory cross-sectional view schematically illustrating the structure in an example of an ultraviolet irradiation apparatus according to the present invention.
Figure 2:
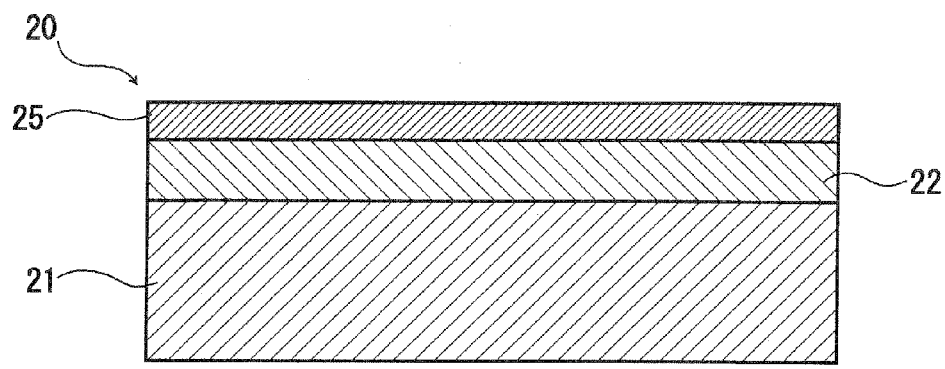
FIG. 2 is an explanatory cross-sectional view illustrating the structure of a semiconductor multi-layered film element in the ultraviolet irradiation apparatus shown in FIG. 1.

FIG. 1 is an explanatory cross-sectional view schematically illustrating the structure in an example of an ultraviolet irradiation apparatus according to the present invention. FIG. 2 is an explanatory cross-sectional view illustrating the structure of a semiconductor multi-layered film element in the ultraviolet irradiation apparatus shown in FIG. 1.

The ultraviolet irradiation apparatus 10 has a vessel (hereafter referred to as a "vacuum vessel") 11 which is sealed to have a negative internal pressure and has a rectangular parallelepiped outer shape. The vacuum vessel 11 is made up of a vessel housing 12, which has an opening on one surface (on the lower surface in FIG. 1), and an ultraviolet transmitting window 13. The ultraviolet transmitting window 13 is installed at the opening of the vessel housing 12 and hermetically sealed to the vessel housing 12 so as to transmit ultraviolet radiation from inside to outside.

The vacuum vessel 11 is provided with a semiconductor multi-layered film element 20 on the inner surface of the ultraviolet transmitting window 13, and at a position opposed to the semiconductor multi-layered film element 20, there is provided an electron beam irradiation source 15 for irradiating the semiconductor multi-layered film element 20 with an electron beam. The electron beam irradiation source 15 and the semiconductor multi-layered film element 20 are electrically connected to electron accelerating means (not shown), for applying an acceleration voltage, through an electrically conductive line (not shown) extracted from inside to outside the vacuum vessel 11, the electron accelerating means being provided outside the vacuum vessel 11.

The vessel housing 12 of the vacuum vessel 11 can be made of glass such as silica glass.

The ultraviolet transmitting window 13 of the vacuum vessel 11 can also be made of silica glass or the like.

The internal pressure of the vacuum vessel 11 is, for example, $10^{-4}$ to $10^{-6}$ Pa.

As the electron beam irradiation source 15, it is possible to employ, for example, a Spindt emitter which has an electron extracting gate electrode disposed around a conical molybdenum chip in the vicinity thereof.

The semiconductor multi-layered film element 20 is made up of, for example, a sapphire substrate 21, a buffer layer 22 such as of AlN formed on one surface of the substrate 21, and an active layer 25 formed on one surface of the buffer layer 22 and having a single quantum well structure or a multi quantum well structure.

The semiconductor multi-layered film element 20 of this example is configured such that with the active layer 25 opposed to the electron beam irradiation source 15, the substrate 21 is securely adhered to the inner surface of the ultraviolet transmitting window 13, for example, by an UV curable resin. Thus, this allows the active layer 25 to be irradiated with an electron beam from the electron beam irradiation source 15.

The substrate 21 is, for example, 10 to 1000 μm in thickness, and the buffer layer 22 is, for example, 100 to 1000 nm in thickness.

Furthermore, the spaced distance between the electron beam irradiation source 15 and the active layer 25 of the semiconductor multi-layered film element 20 is, for example, 5 to 120 mm.

Figure 3:
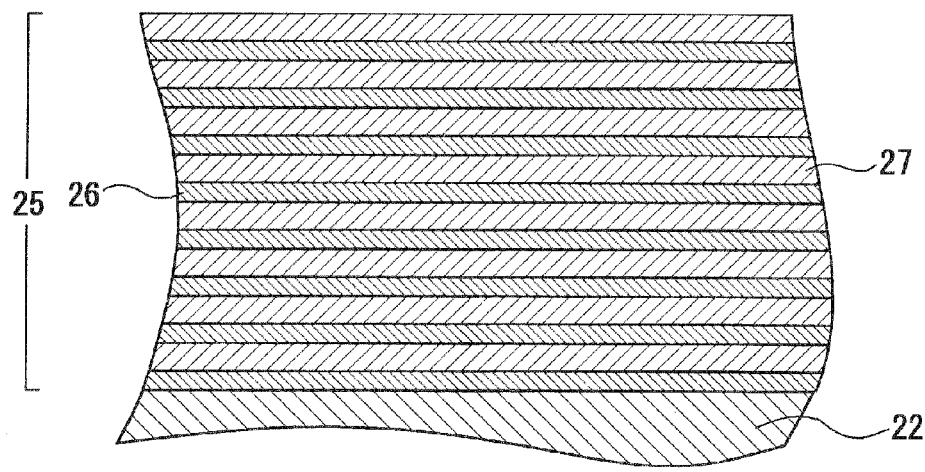
FIG. 3 is an explanatory cross-sectional view illustrating the structure of an active layer in the semiconductor multi-layered film element.

FIG. 3 is an explanatory cross-sectional view illustrating the structure in an example of the active layer. The active layer 25 has a single quantum well structure or a multi quantum well structure in which a single or a plurality of quantum well layers 26 or a single or a plurality of barrier layers 27, each formed of $In_xAl_yGa_{1-x-y}N$ ($0 \leq x < 1$, $0 < y \leq 1$, $x+y \leq 1$), are alternately deposited one on another in that order on top of the buffer layer 22.

Each of the quantum well layers 26 is, for example, 0.5 to 50 nm in thickness. On the other hand, the composition of the barrier layer 27 is selected so that the forbidden band width thereof is greater than that of the quantum well layers 26, and by way of example, AlN may be employed. The thickness of each of the barrier layers 27 is set to be greater than the well width of the quantum well layers 26, and specifically, for example, 1 to 100 nm.

The cycle of the quantum well layers 26 forming the active layer 25 is appropriately set by taking into account, for example, the thickness of the quantum well layer 26 and the barrier layer 27 and the entire active layer 25 or the acceleration voltage of an electron beam to be employed, and the cycle is typically 1 to 100.

The aforementioned semiconductor multi-layered film element 20 can be formed, for example, by metal-organic chemical vapor deposition (MOCVD). More specifically, a carrier gas of hydrogen and nitrogen and a raw material gas of trimethylaluminum and ammonia are used to form the buffer layer 22 of AlN in a predetermined thickness by vapor phase growth on the (0001) plane of the sapphire substrate 21. After that, a carrier gas of hydrogen gas and nitrogen gas and a raw material gas of trimethylaluminum, trimethylgallium, trimethylindium, and ammonia are used to form the active layer 25 by vapor phase growth on the buffer layer 22. The active layer 25 has a single quantum well structure or a multi quantum well structure of $In_xAl_yGa_{1-x-y}N$ ($0 \leq x < 1$, $0 < y \leq 1$, $x+y \leq 1$) in a predetermined thickness. In this manner, the semiconductor multi-layered film element 20 can be formed.

In each of the aforementioned steps of forming the buffer layer 22, the quantum well layers 26, and the barrier layers 27, the conditions such as the processing temperature, the processing pressure, and the growth rate of each layer can be set as appropriate, for example, depending on the composition or the thickness of the buffer layer 22, the quantum well layer 26, and the barrier layer 27 to be formed.

On the other hand, the method for forming the semiconductor multi-layered film is not limited to the MOCVD method, but, for example, the molecular beam epitaxy (MBE) method can also be employed.

In this ultraviolet irradiation apparatus 10, electrons emitted from the electron beam irradiation source 15 serve as an electron beam, with which the active layer 25 of the semiconductor multi-layered film element 20 is irradiated, after being accelerated by an acceleration voltage applied between the electron beam irradiation source 15 and the semiconductor multi-layered film element 20. This allows the semiconductor multi-layered film element 20 to emit ultraviolet radiation out of the vessel through the ultraviolet transmitting window 13.

Furthermore, the ultraviolet irradiation apparatus 10 of the present invention satisfies Equation (1) below $$4.18 \times V^{1.50} \leq t \leq 10.6 \times V^{1.54} \quad \text{Equation (1)}$$

where V (kV) is the acceleration voltage of an electron beam emitted from the electron beam irradiation source 15 and t (nm) is the thickness of the active layer 25.

In the relation between the acceleration voltage of the electron beam and the thickness of the active layer 25, in case that the thickness of the active layer 25 is excessively small (the acceleration voltage is excessively high), part of the electron beam passes through the active layer 25, causing an increase in electrons which do not contribute to electron-hole pair generation in the active layer 25, with a result, it is difficult to emit ultraviolet radiation with high efficiency. On the other hand, the thickness of the active layer 25 may be excessively large (the acceleration voltage is excessively low). In this case, the energy of the electron beam is lost in the layer portion of the front side of the active layer 25 which is irradiated with the electron beam, thereby generating no electron hole pairs in the layer portion of the rear side of the active layer 25. As a result, it is difficult to emit ultraviolet radiation with high efficiency.

Furthermore, the acceleration voltage of the electron beam is preferably 20 kV or lower, more preferably 5 to 13 kV. With the acceleration voltage of an electron beam greater than 20 kV, the semiconductor multi-layered film element 20 is likely to produce an X-ray, and thus a structure for blocking the X-ray is required. This makes it difficult to reduce the apparatus in size, and the energy of the electron beam unpreferably causes thermal damage to the semiconductor multi-layered film element 20.

Equation (1) above was empirically derived. Now, a description will be made to an example experiment which was carried out to derive Equation (1) above.

Example Experiment 1

Forming the Buffer Layer

The substrate (21) of sapphire was placed in a processing chamber of a CVD apparatus, and the internal pressure of the chamber was set to 10 kPa and the temperature inside the chamber was set to 1080° C. While a nitrogen gas and a hydrogen gas were allowed to flow as a carrier gas within the processing chamber, a raw material gas of trimethylaluminum and ammonia was supplied into the processing chamber and deposited by vapor phase growth on the (0001) plane of the substrate (21). This allows for forming the buffer layer (22) of AlN single crystal in a thickness of 600 nm.

[Forming the Active Layer]

Subsequently, the internal pressure of the chamber was set to 10 kPa and the temperature inside the chamber was set to 1080° C. While a nitrogen gas and a hydrogen gas were allowed to flow as carrier gases, a raw material gas of trimethylaluminum, trimethylgallium, and ammonia was supplied into the processing chamber, thereby forming the quantum well layer (26) of $Al_{0.69}Ga_{0.21}N$ in a thickness of 1 nm. Subsequently, a raw material gas of trimethylaluminum and ammonia is supplied into the processing chamber, thereby forming the barrier layer (27) of AlN in a thickness of 15 nm. Such a procedure for forming the quantum well layer (26) and the barrier layer (27) was repeated eight times in total in order to form the active layer (25) in a thickness of 128 nm (an 8-cycle quantum well structure), thereby forming the semiconductor multi-layered film element (20)

[Manufacturing the Ultraviolet Irradiation Apparatus]

The electron beam irradiation source (15) with a Spindt emitter having a molybdenum chip was disposed on the bottom of the vessel housing (12) of glass, which has an outer size of 40 mm×25 mm×25 mm, an opening of 7 mm×5 mm on one surface, and a thickness of 4 mm. Meanwhile, the semiconductor multi-layered film element (20) was disposed on one surface of the plate-shaped ultraviolet transmitting window (13) of silica glass in a size of 7 mm×5 mm×4 mm so that the substrate (21) of the semiconductor multi-layered film element (20) was in contact with the ultraviolet transmitting window (13) and then securely adhered with UV curable resin thereto. Subsequently, the ultraviolet transmitting window (13) was disposed on the opening of the vessel housing (12) so that the semiconductor multi-layered film element (20) was opposed to the electron beam irradiation source (15), and then the vessel housing (12) was evacuated to be at an internal pressure of $1 \times 10^{-6}$ Pa. The ultraviolet transmitting window (13) was further hermetically sealed to the vessel housing (12) in order to form the vacuum vessel (11), thereby manufacturing the ultraviolet irradiation apparatus.

Here, the spaced distance between the electron beam irradiation source (15) and the active layer (25) of the semiconductor multi-layered film element (20) was 30 mm.

Furthermore, ultraviolet irradiation apparatuses with semiconductor multi-layered film elements (20) having active layers (25) were manufactured in the same manner as above except that in the step of forming the active layers, the procedure of forming the quantum well layer (26) and the barrier layer (27) was repeated once, six times, ten times, and 15 times. Thus, the respective active layers (25) had a thickness of 16 nm (the cycle of the quantum well layer was one), 96 nm (the cycle of the quantum well layer was six), 160 nm (the cycle of the quantum well layer was ten), and 240 nm (the cycle of the quantum well layer was 15).

Hereinafter, the ultraviolet irradiation apparatus having the active layer (25) of a thickness of 16 nm will be referred to as "the ultraviolet irradiation apparatus "A";" the ultraviolet irradiation apparatus having the active layer (25) of a thickness of 96 nm will be referred to as "the ultraviolet irradiation apparatus "B";" the ultraviolet irradiation apparatus having the active layer (25) of a thickness of 128 nm will be referred to as "the ultraviolet irradiation apparatus "C";" the ultraviolet irradiation apparatus having the active layer (25) of a thickness of 160 nm will be referred to as "the ultraviolet irradiation apparatus "D";" and the ultraviolet irradiation apparatus having the active layer (25) of a thickness of 240 nm will be referred to as "the ultraviolet irradiation apparatus "E"."

Then, the ultraviolet irradiation apparatus "A" to the ultraviolet irradiation apparatus "E" were activated, thereby allowing it to be confirmed that all the apparatuses emitted ultraviolet radiation at a peak wavelength of 240 nm.

[Test]

The ultraviolet irradiation apparatus "A" to the ultraviolet irradiation apparatus "E" were activated by changing the acceleration voltage of an electron beam in a stepwise manner in the range from 0 to 20 kV, the output of ultraviolet radiation being emitted was measured by means of a photodiode having sensitivity to light in the ultraviolet region, thereby determining the light-output efficiency. Here, the light-output efficiency of the present invention is determined by the ratio of the emitted light power measured on the photodiode to the electron beam power incident upon the semiconductor multi-layered film element.

Figure 4:
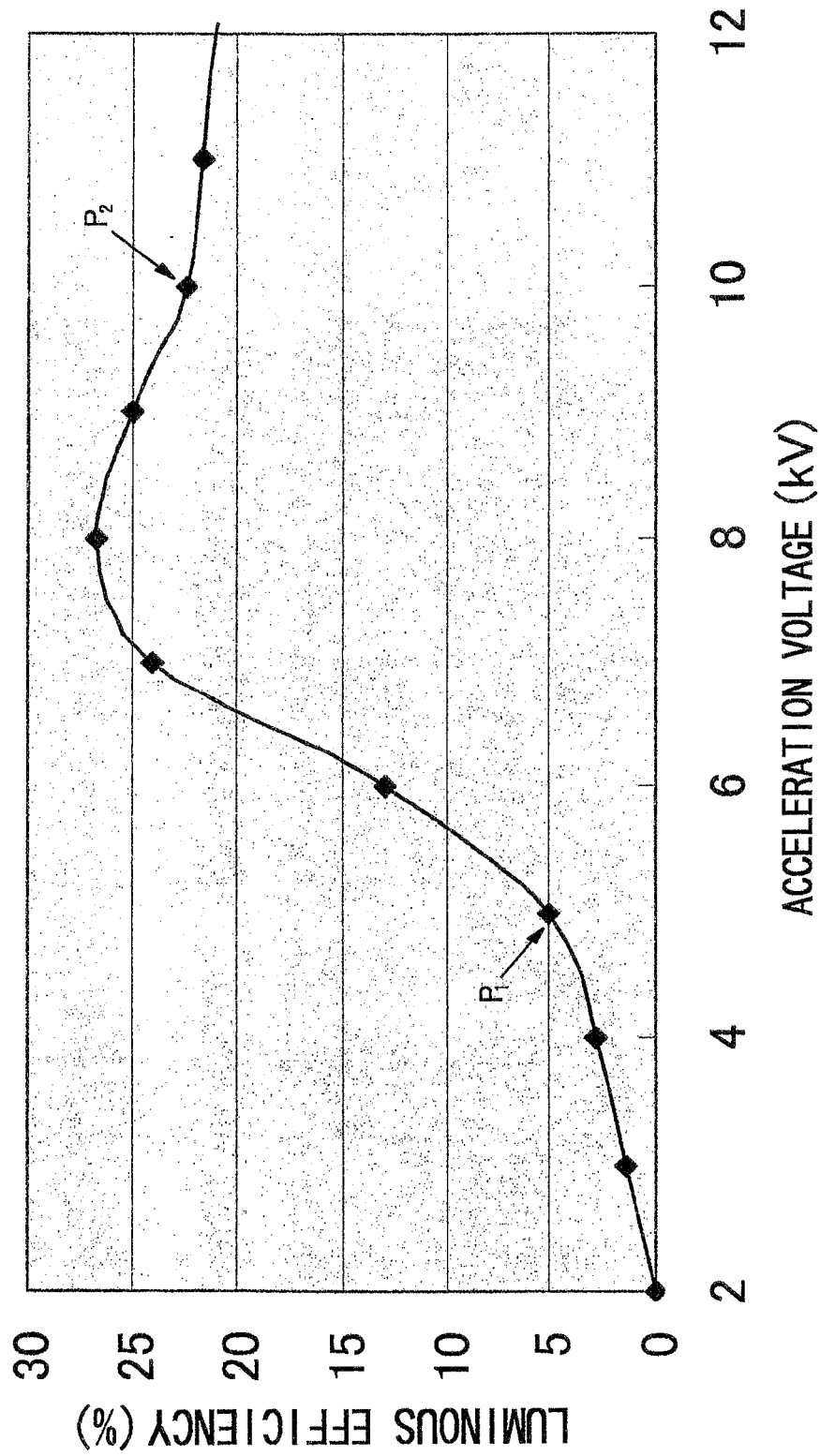
FIG. 4 is a light-output (power) efficiency graph showing the relation between the acceleration voltage of an electron beam and the light-output efficiency of an ultraviolet irradiation apparatus "C".

FIG. 4 is a light-output efficiency graph showing the relation between the acceleration voltage of an electron beam and the light-output efficiency of the ultraviolet irradiation apparatus "C". In FIG. 4, the horizontal axis represents the acceleration voltage of an electron beam (kV), and the vertical axis represents the light-output efficiency (%). The following can be understood from the results shown in FIG. 4.

In the ultraviolet irradiation apparatus "C", while the acceleration voltage of an electron beam reaches about 5 kV from 0 kV, the light-output efficiency gradually increases as the acceleration voltage of an electron beam increases. While the acceleration voltage of an electron beam changes from about 5 kV to about 8 kV, the light-output efficiency abruptly increases as the acceleration voltage of an electron beam increases, that is, the rate of increase of the light-output efficiency becomes higher. Then, the light-output efficiency reaches the peak at an acceleration voltage of an electron beam of about 8 kV, and then while the acceleration voltage of an electron beam changes from about 8 kV to about 10 kV, the light-output efficiency decreases as the acceleration voltage of an electron beam increases. At an acceleration voltage of an electron beam of about 10 kV or greater, the light-output efficiency gradually decreases as the acceleration voltage of an electron beam increases, that is, the rate of decrease of the light-output efficiency is reduced when compared to that for about 8 kV to about 10 kV.

As described above, the light-output efficiency curve of the ultraviolet irradiation apparatus "C" has Point $P_1$ at which the rate of increase of the light-output efficiency is raised and Point $P_2$ at which the rate of decrease of the light-output efficiency is reduced, when the acceleration voltage of an electron beam is increased.

Figure 5:
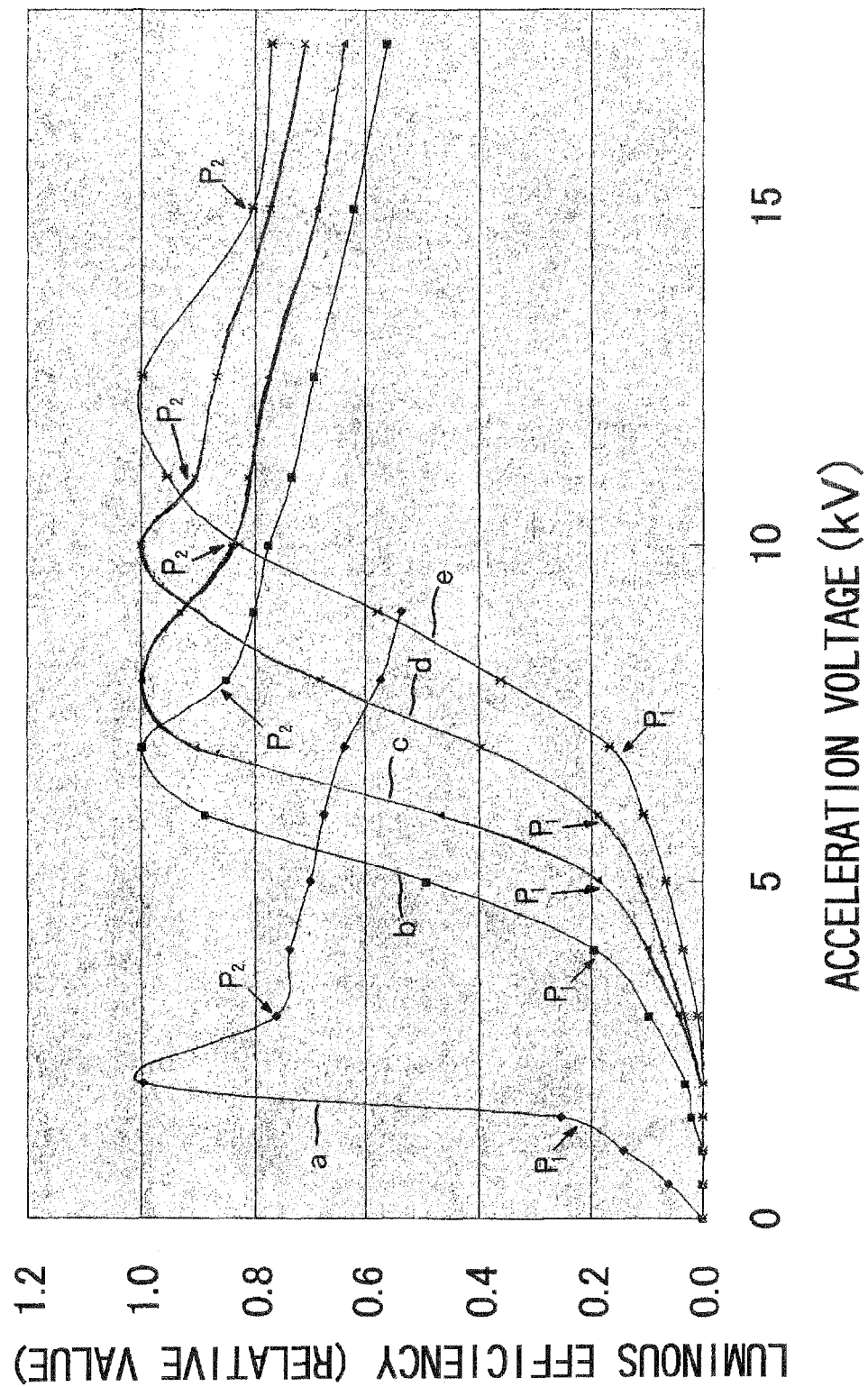
FIG. 5 is a light-output efficiency graph showing the relation between the acceleration voltage of an electron beam and the light-output efficiency of an ultraviolet irradiation apparatus "A" to an ultraviolet irradiation apparatus "E".

FIG. 5 is a light-output efficiency graph showing the relation between the acceleration voltage of an electron beam and the light-output efficiency of the ultraviolet irradiation apparatus "A" to the ultraviolet irradiation apparatus "E". In FIG. 5, the horizontal axis represents the acceleration voltage of an electron beam (kV) and the vertical axis represents the relative value of the light-output efficiency with the peak value of the light-output efficiency being unity. Curve "a" is the light-output efficiency curve according to the ultraviolet irradiation apparatus "A"; Curve "b" is the light-output efficiency curve according to the ultraviolet irradiation apparatus "B"; Curve "c" is the light-output efficiency curve according to the ultraviolet irradiation apparatus "C"; Curve "d" is the light-output efficiency curve according to the ultraviolet irradiation apparatus "D"; and Curve "e" is the light-output efficiency curve according to the ultraviolet irradiation apparatus "E".

From the results of FIG. 5, it is understood that in all the ultraviolet irradiation apparatus "A" to the ultraviolet irradiation apparatus "E", Curve "a" to Curve "e" showing the respective light-output efficiency curves have Point $P_1$ at which the rate of increase of the light-output efficiency increases and Point $P_2$ at which the rate of decrease of the light-output efficiency is reduced, when the acceleration voltage of an electron beam is increased. That is, the light-output efficiency gradually increases as the acceleration voltage of an electron beam increases. Thus, past Point $P_1$, the light-output efficiency abruptly increases to reach the peak as the acceleration voltage increases; past the peak, the light-output efficiency decreases as the acceleration voltage of an electron beam increases; and past Point $P_2$, the light-output efficiency gradually decreases as the acceleration voltage of an electron beam increases. Furthermore, on each of Curve "a" to Curve "e", Point $P_1$ is the point at which the slope of the tangent is 0.15 (kV$^{-1}$), while Point $P_2$ is the point at which the slope of the tangent is −0.1 (kV$^{-1}$).

Furthermore, concerning Curve "a" to Curve "e", it is considered that the values of the acceleration voltage at each Point $P_1$ and the acceleration voltage at each Point $P_2$ fall within the range of acceleration voltage in which the ultraviolet irradiation apparatuses can emit ultraviolet radiation with high efficiency.

Figure 6:
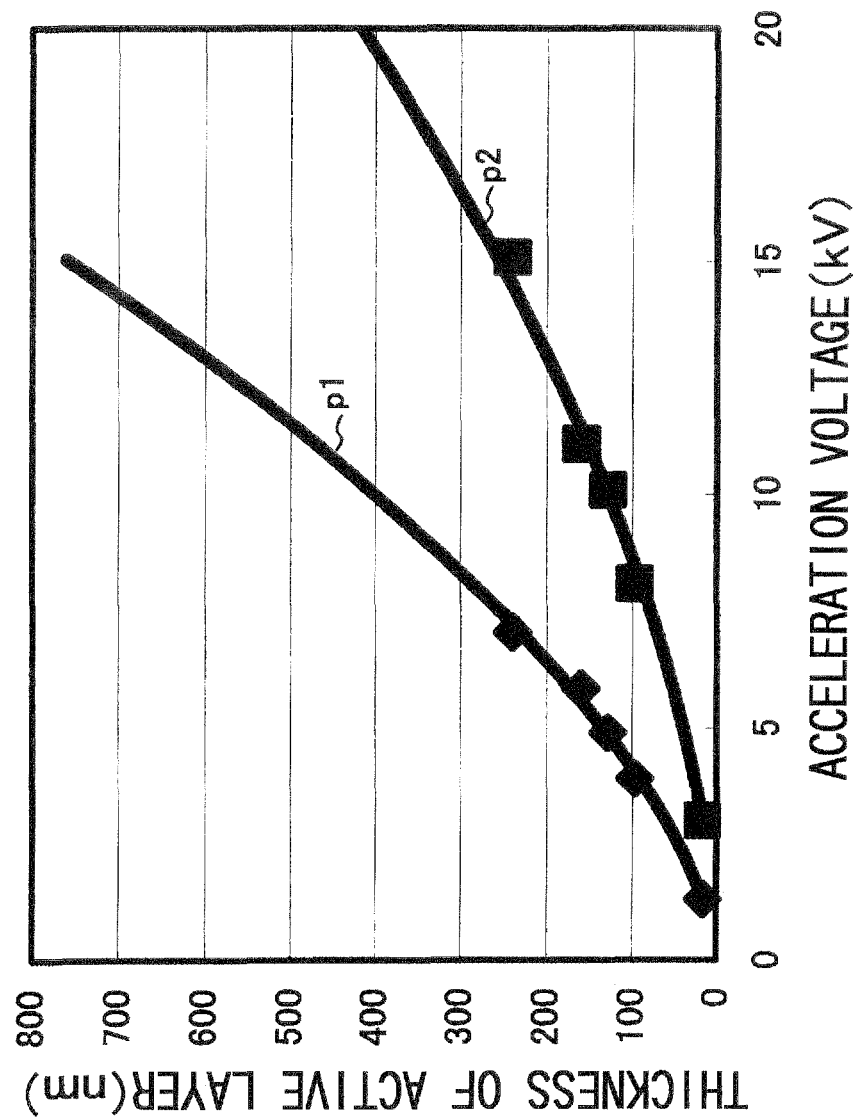
FIG. 6 is a graph showing the relation between the acceleration voltage of an electron beam and the thickness of an active layer corresponding to Point $P_1$ and Point $P_2$ on Curve "a" to Curve "e" shown in FIG. 5.

FIG. 6 is a graph showing the relation between the acceleration voltage of an electron beam and the thickness of an active layer at Point $P_1$ and Point $P_2$ on Curve "a" to Curve "e" shown in FIG. 5. In FIG. 6, the horizontal axis represents the acceleration voltage of an electron beam (kV) and the vertical axis represents the thickness of an active layer (nm). Curve p1 is an approximate curve passing through the plotted points of Point $P_1$, and Curve p2 is an approximate curve passing through the plotted points of Point $P_2$. Then, analysis of function $t=F_1(V)$ for Curve p1 shows that $t=10.6 \times V^{1.54}$ and analysis of function $t=F_2(V)$ for Curve p2 shows that $t=4.18 \times V^{1.50}$, where V is the acceleration voltage of an electron beam and "t" is the thickness of an active layer. Therefore, it is understood that ultraviolet radiation can be emitted with high efficiency if it is satisfied that "t" (the thickness of an active layer) is $4.18 \times V^{1.50}$ or greater and $10.6 \times V^{1.54}$ or less, that is, $4.18 \times V^{1.50} \leq t \leq 10.6 \times V^{1.54}$.

In this manner, Equation (1) above can be experimentally derived.

Example Experiment 2

An ultraviolet irradiation apparatus was manufactured in the same manner as the ultraviolet irradiation apparatus "C" except that in the step of forming the active layer of the example experiment 1, the temperature inside the chamber, the flow rate of trimethylaluminum, and the flow rate of trimethylgallium were changed to form the quantum well layer (26) of $Al_{0.10}Ga_{0.90}N$ in a thickness of 1 nm and the active layer (25) in a thickness of 128 nm (the cycle of the quantum well layer is eight). Hereinafter, this ultraviolet irradiation apparatus will be referred to as the "ultraviolet irradiation apparatus "F"."

On the other hand, another ultraviolet irradiation apparatus was also manufactured in the same manner as the ultraviolet irradiation apparatus "C" except that in the step of forming the active layer of the example experiment 1, the temperature inside the chamber, the flow rate of trimethylaluminum, and the flow rate of trimethylgallium were changed to form the quantum well layer (26) of $Al_{0.90}Ga_{0.10}N$ in a thickness of 1 nm and form the active layer (25) in a thickness of 128 nm (the cycle of the quantum well layer is eight). Hereinafter, this ultraviolet irradiation apparatus will be referred to as the "ultraviolet irradiation apparatus "G"."

It was confirmed that when activated, the ultraviolet irradiation apparatus "F" emitted ultraviolet radiation at a peak wavelength of 370 nm, and when activated, the ultraviolet irradiation apparatus "G" emitted ultraviolet radiation at a peak wavelength of 215 nm.

The ultraviolet irradiation apparatus "F" and the ultraviolet irradiation apparatus "G" were operated while the acceleration voltage of an electron beam was changed in a stepwise manner within the range from 0 to 20 kV. Meanwhile, the output of the ultraviolet radiation being emitted was measured by a photodiode having sensitivity to light in the ultraviolet region, thereby determining the light-output efficiency.

Figure 7:
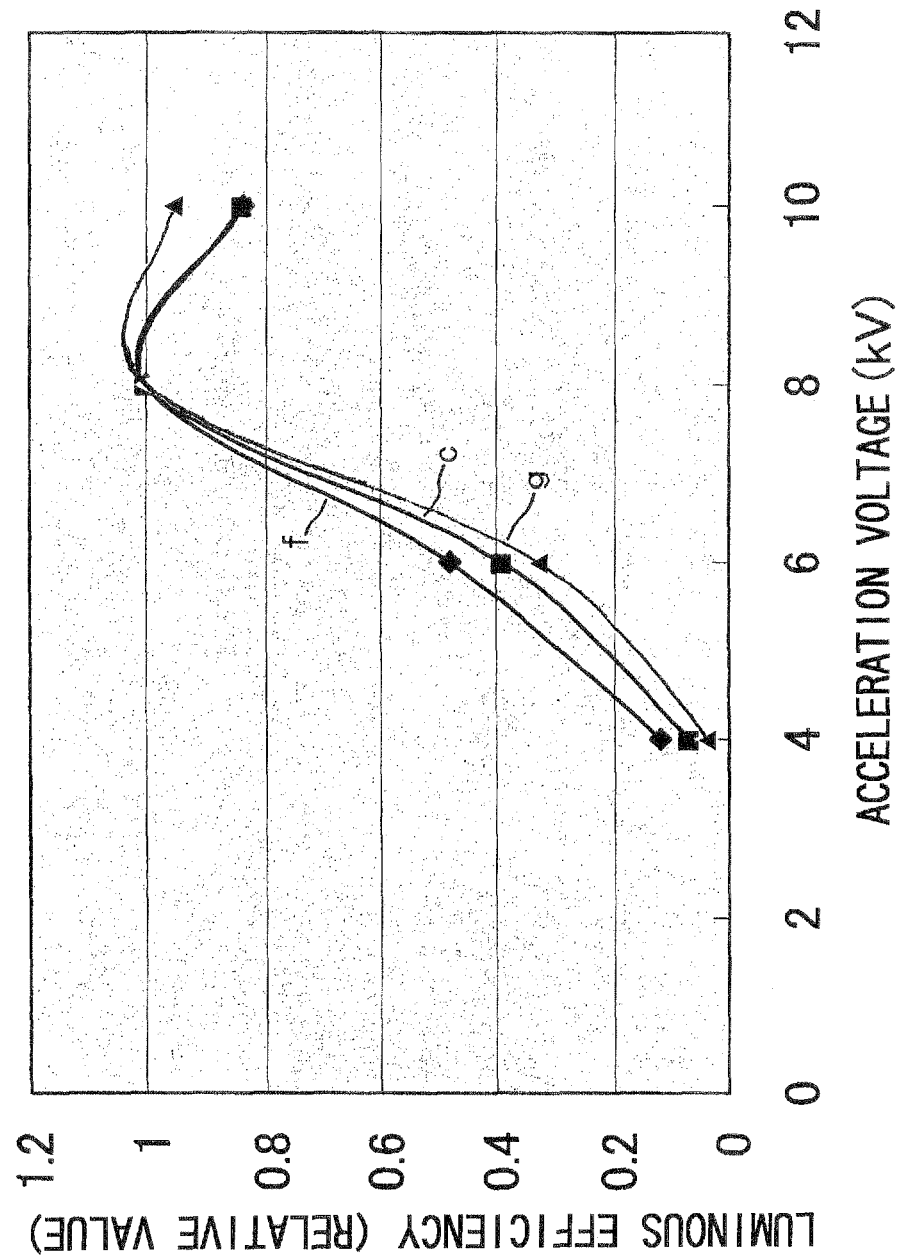
FIG. 7 is a light-output efficiency graph showing the relation between the acceleration voltage of an electron beam and the light-output efficiency according to the ultraviolet irradiation apparatus "C", the ultraviolet irradiation apparatus "F", and the ultraviolet irradiation apparatus "G".

FIG. 7 is a light-output efficiency graph showing the relation between the acceleration voltage of an electron beam and the light-output efficiency of the ultraviolet irradiation apparatus "C", the ultraviolet irradiation apparatus "F", and the ultraviolet irradiation apparatus "G". In FIG. 7, the horizontal axis represents the acceleration voltage of an electron beam (kV) and the vertical axis represents the relative value of the light-output efficiency with the value of the light-output efficiency being unity at an acceleration voltage of an electron beam of 8 kV. Curve "c" is the light-output efficiency curve of the ultraviolet irradiation apparatus "C", Curve "f" is the light-output efficiency curve of the ultraviolet irradiation apparatus "F", and Curve "g" is the light-output efficiency curve of the ultraviolet irradiation apparatus "G".

From the results of FIG. 7, it is understood that all the ultraviolet irradiation apparatus "F" and the ultraviolet irradiation apparatus "G", which are different in the composition of the quantum well layer (26) from the ultraviolet irradiation apparatus "C", can provide the same light-output efficiency curve as that of the ultraviolet irradiation apparatus "C". It is thus understood that irrespective of the composition of the quantum well layer (26), a high light-output efficiency can be obtained by satisfying Equation (1) above.

As described above, according to the ultraviolet irradiation apparatus of the present invention, the thickness of the active layer 25 of the semiconductor multi-layered film element 20 falls within a particular range in relation to the acceleration voltage of an electron beam, whereby it is possible to emit ultraviolet radiation with high efficiency. Furthermore, since a high efficiency can be achieved even at a low acceleration voltage of an electron beam, the apparatus can be reduced in size.

The ultraviolet irradiation apparatus of the present invention may be provided in the vacuum vessel with a plurality of semiconductor multi-layered film elements, in which the plurality of semiconductor multi-layered film elements may emit light at wavelengths different from each other.

For example, in the ultraviolet irradiation apparatus constructed as shown in FIG. 1, two semiconductor multi-layered film elements, one semiconductor multi-layered film element emitting light at a wavelength of 250 nm and the other semiconductor multi-layered film element emitting light at a wavelength of 310 nm, may be disposed side by side. The ultraviolet irradiation apparatus allows the active layer of each of the semiconductor multi-layered film elements to be irradiated with an electron beam from the common electron beam irradiation source, thereby emitting ultraviolet radiation with two peak wavelengths of 250 nm and 310 nm.

Figure 8:
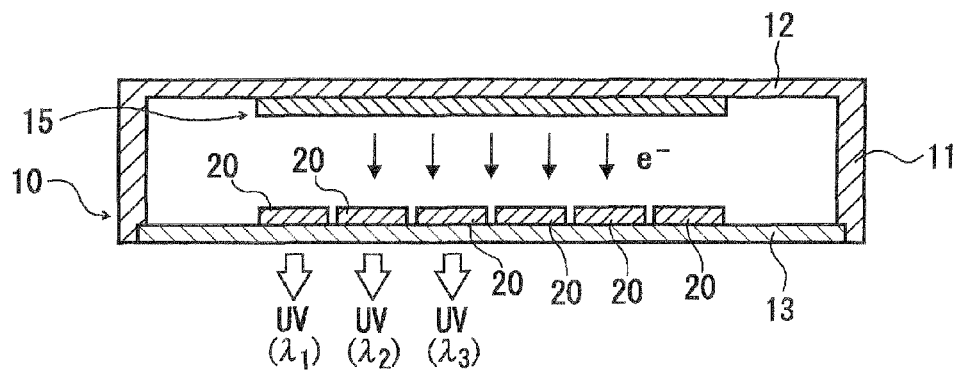
FIG. 8 is an explanatory view schematically illustrating the structure in another example of an ultraviolet irradiation apparatus according to the present invention; (A) a cross-sectional view, and (B) a plan view when viewed from an electron beam irradiation source.
Figure 8:
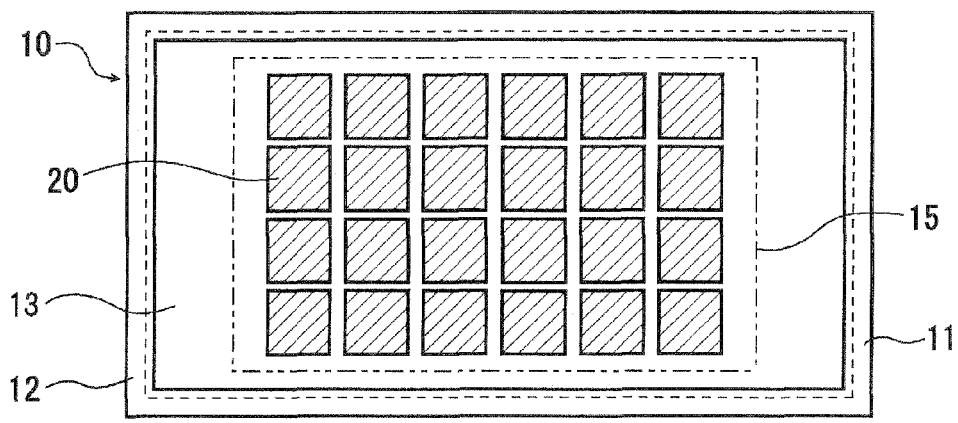

Furthermore, as shown in FIGS. 8(A) and (B), the ultraviolet irradiation apparatus 10 can be configured such that, for example, twenty four semiconductor multi-layered film elements 20 emitting light at wavelengths different from each other are disposed in a matrix and all the semiconductor multi-layered film elements 20 are irradiated with an electron beam from the common electron beam irradiation source 15, thereby emitting ultraviolet radiation with a plurality of peak wavelengths ($\lambda 1, \lambda 2, \lambda 3, \ldots$).

REFERENCE SIGNS LIST

10 ultraviolet irradiation apparatus
11 vacuum vessel
12 vessel housing
13 ultraviolet transmitting window
15 electron beam irradiation source
20 semiconductor multi-layered film element
21 substrate
22 buffer layer
25 active layer
26 quantum well layer
27 barrier layer

The invention claimed is:

1. An ultraviolet irradiation apparatus comprising, in a vessel, a semiconductor multi-layered film element and an electron beam irradiation source for irradiating the semiconductor multi-layered film element with an electron beam, the vessel being hermetically sealed to have a negative internal pressure and having an ultraviolet transmitting window, wherein:

the semiconductor multi-layered film element includes an active layer having a single quantum well structure or a multi quantum well structure of $In_xAl_yGa_{1-x-y}N$ ($0 \leq x < 1$, $0 < y \leq 1$, $x+y \leq 1$);

the active layer of the semiconductor multi-layered film element is irradiated with an electron beam from the electron beam irradiation source, thereby allowing the semiconductor multi-layered film element to emit ultraviolet radiation out of the vessel through the ultraviolet transmitting window; and a following equation (1) is satisfied:

$$4.18 \times V^{1.50} \leq t \leq 10.6 \times V^{1.54} \quad \text{Equation (1),}$$

where V (kV) is an acceleration voltage of the electron beam and t (nm) is a thickness of the active layer.

2. The ultraviolet irradiation apparatus according to claim 1, wherein the acceleration voltage of the electron beam is 20 kV or lower.

* * * * *